(12) United States Patent
Gao et al.

(10) Patent No.: US 10,351,419 B2
(45) Date of Patent: Jul. 16, 2019

(54) INTEGRATED PACKAGE CONTAINING MEMS ACOUSTIC SENSOR AND PRESSURE SENSOR

(71) Applicant: INVENSENSE, INC., San Jose, CA (US)

(72) Inventors: Jia Gao, Winchester, MA (US); Brian Kim, Fremont, CA (US); Peter George Hartwell, Menlo Park, CA (US); Mozafar Maghsoudnia, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 15/160,127

(22) Filed: May 20, 2016

(65) Prior Publication Data

US 2017/0334714 A1 Nov. 23, 2017

(51) Int. Cl.
 *B81B 7/02* (2006.01)
 *B81C 1/00* (2006.01)
 (Continued)

(52) U.S. Cl.
 CPC ............. *B81B 7/02* (2013.01); *B81C 1/0023* (2013.01); *B81C 1/00277* (2013.01); *B81C 1/00285* (2013.01); *H01L 23/10* (2013.01); *H04R 1/028* (2013.01); *H04R 1/04* (2013.01); *B81B 2201/0257* (2013.01); *B81B 2201/0264* (2013.01); *B81B 2207/012* (2013.01); *B81B 2207/098* (2013.01); *H01L 2224/05014* (2013.01); *H01L 2224/16225* (2013.01);
 (Continued)

(58) Field of Classification Search
 CPC ......... H01L 23/04; H01L 23/06; H01L 23/10; H01L 23/053; B81B 7/0064; B81B 7/0038; B81B 7/0051; B81B 7/0061; B81C 1/00269; B81C 1/00285; B81C 1/00277; H04R 1/028; H04R 1/04
 See application file for complete search history.

(56) References Cited

U.S. PATENT DOCUMENTS 8,169,041 B2   5/2012   Pahl et al.
8,723,308 B2   5/2014   Yang et al.
(Continued)

FOREIGN PATENT DOCUMENTS

| KR | 101454325 B1 | 11/2014 |
| KR | 20140143588 A | 12/2014 |
| WO | 2012122872 A1 | 9/2012 |

OTHER PUBLICATIONS

Fischer, et al., "Integrating MEMS and ICs," Microsystems & Nanoengineering, May 28, 2015, 16 pages.
(Continued)

*Primary Examiner* — Ermias T Woldegeorgis
(74) *Attorney, Agent, or Firm* — Amin, Turocy & Watson, LLP (57) ABSTRACT

Integrated microelectromechanical systems (MEMS) acoustic sensor devices are disclosed. Integrated MEMS acoustic sensor devices can comprise a MEMS acoustic sensor element and a pressure sensor within the back cavity associated with the MEMS acoustic sensor element. Integrated MEMS acoustic sensor devices can comprise a port adapted to receive acoustic waves or pressure. Methods of fabrication are also disclosed.

19 Claims, 9 Drawing Sheets (51) Int. Cl.
   *H04R 1/04* (2006.01)
   *H04R 1/02* (2006.01)
   *H01L 23/10* (2006.01)

(52) U.S. Cl.
   CPC .............. *H01L 2224/32145* (2013.01); *H01L 2224/48091* (2013.01); *H01L 2224/48137* (2013.01); *H01L 2224/48465* (2013.01); *H01L 2224/73265* (2013.01); *H01L 2924/15151* (2013.01); *H01L 2924/16152* (2013.01)

(56) References Cited

U.S. PATENT DOCUMENTS

| | | |
|---|---|---|
| 8,779,535 B2 | 7/2014 | Goida et al. |
| 9,187,317 B2 | 11/2015 | Cheng et al. |
| 2008/0315333 A1 | 12/2008 | Combi et al. |
| 2009/0314095 A1 | 12/2009 | Lu |
| 2011/0126632 A1 | 6/2011 | McNeil et al. |
| 2012/0270354 A1* | 10/2012 | Hooper ................ G01L 19/141 438/51 |
| 2013/0322675 A1 | 12/2013 | Zoellin et al. |
| 2014/0001579 A1* | 1/2014 | Liu ..................... G01L 9/0073 257/415 |
| 2014/0001580 A1 | 1/2014 | Bolognia et al. |
| 2014/0116122 A1* | 5/2014 | Lammel .............. G01L 19/0092 73/73 |
| 2014/0210019 A1 | 7/2014 | Nasirt et al. |
| 2014/0264653 A1 | 9/2014 | Cheng et al. |
| 2015/0014798 A1 | 1/2015 | Faralli et al. |
| 2015/0158722 A1* | 6/2015 | Lim ...................... B81B 7/02 257/416 |
| 2015/0321906 A1 | 11/2015 | Tsai et al. |
| 2015/0350793 A1 | 12/2015 | Khenkin et al. |
| 2015/0369681 A1* | 12/2015 | Imai ..................... G01C 5/06 73/727 |
| 2016/0037245 A1 | 2/2016 | Harrington |

OTHER PUBLICATIONS

International Search Report and Written Opinion dated Aug. 16, 2017 for PCT Application Serial No. PCT/US2017/029981, 9 pages.
Communication pursuant to Rules 161(1) and 162 EPC for European Patent Application No. 17722627.1 dated Jan. 7, 2019, 3 pages.

* cited by examiner

INTEGRATED PACKAGE CONTAINING MEMS ACOUSTIC SENSOR AND PRESSURE SENSOR

TECHNICAL FIELD

Embodiments of the subject disclosure relate generally to acoustic and pressure sensors, and particularly to the integrated packaging of these sensors.

BACKGROUND

Integration of component devices of a consumer electronics product is desirable to reduce form factor. Integration often results in size reduction because multiple devices become parts of one integrated system. In addition to integration being highly desirable for smaller device footprint, cost reductions and/or additional functionalities can be made possible through integration. However, integration of multiple devices into one system can be complex and can be made more complex in cases where each device is of a different type and/or where each device has different manufacturing and/or assembly requirements.

For example, conventionally, acoustic sensors (e.g., microphones) and pressure sensors are two separate devices. These two devices are separately tested and mounted on a customer printed circuit board (PCB) board, separately. This results in customer PCB real estate cost in addition to complexity of manufacturing, as each component must be assembled and tested separately on to the host circuit board of the product, whereas in other vertically integrated combinations, unique device configurations may be required to integrate functionality, while approaching device height limitations and while presenting limited options for rework in the event of individual sensor failure. Moreover, separately mounted and tested devices can introduce manufacturing variables into the device test and setup with reduced opportunities to improve process control and/or with added difficulty in implementing additional functionality based on the two separately mounted and tested devices with uncontrolled spacing between the two devices.

It would be desirable to have an integrated package and methodology for making an integrated package that contains both acoustic and pressure sensors and also an application specific integrated circuit (ASIC) for processing data generated by one or more of these sensors.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, sensor devices integrated in a package are described that can comprise a microelectromechanical systems (MEMS) acoustic sensor, a pressure sensor, and an ASIC disposed in a back cavity associated with the MEMS acoustic sensor. In other non-limiting examples, integrated microphone and pressure sensing devices are provided that can comprise a stacked arrangement of a pressure sensor and an ASIC associated with a MEMS acoustic sensor and disposed in a back cavity associated with the MEMS acoustic sensor. In further non-limiting examples, exemplary methods associated with non-limiting integrated MEMS acoustic sensor device are described.

These and other embodiments are described in more detail below.

DETAILED DESCRIPTION

In the described embodiments, integrated circuit (IC) substrate may refer to a silicon substrate with electrical circuits, typically complementary metal oxide semiconductor (CMOS) circuits. Also, a CMOS IC substrate may include an ASIC. A cavity may refer to a recess in a substrate or a lid (cover). An enclosure may refer to a fully enclosed volume typically surrounding the microelectromechanical systems (MEMS) structure and typically formed by the IC substrate, structural layer, MEMS substrate, and the standoff seal ring. A port may be an opening through a substrate to expose the MEMS structure to the surrounding environment. It is to be appreciated that an enclosure would include an acoustic port, in various embodiments of the subject disclosure.

In the described embodiments, a chip includes at least one substrate typically formed from a semiconductor material. A single chip may be formed from multiple substrates, where the substrates are mechanically bonded to preserve the functionality. Multiple chips include at least two substrates, wherein the two substrates can be electrically connected, and may comprise, but do not require, mechanical bonding. A package provides electrical connection between the bond pads on the chip to a metal pad that can be soldered to a printed circuit board (PCB). A package typically comprises a substrate and a cover. It is to be appreciated that the package hermetically seals its components, with the exception that the port opening of the package allows for air flow in and out of the package. Also, it is to be appreciated that the package provides an acoustic seal, with the exception that the port opening of the package allows for sound waves or pressure to enter and exit the package.

In the described embodiments, a cavity may refer to an opening or recession in a substrate wafer and enclosure may refer to a fully enclosed space that includes a port opening. In the described embodiments, a back cavity may refer to a partial enclosed cavity equalized to ambient pressure. In various aspects of the subject disclosure, the back cavity provides acoustic sealing, with the exception that it allows sound waves to enter and exit by way of an acoustic MEMS acoustic sensor element (e.g., comprising a diaphragm, a backplate, etc.). In some embodiments, a back cavity can also be referred to as a back chamber. A back cavity formed within a CMOS-MEMS device can be referred to as integrated back cavity.

In the described embodiments, a rigid structure within an acoustic system that moves when subject to force may be referred to as a plate. A back plate may be a perforated plate used as an electrode to electrically sense the movable plate. In the described embodiments, perforations can refer to acoustic openings for reducing air damping in moving plates. An acoustic port may refer to an opening for sensing acoustic waves or pressure. Acoustic barrier may be a structure that prevents acoustic pressure from reaching certain portions of the device.

As described in the background, various device and package considerations can preclude the integration of existing MEMS acoustic sensor device designs and other sensors, such as, for example a pressure sensor. In various non-limiting embodiments, the disclosed subject matter provides integrated MEMS acoustic sensor devices, in which an ASIC CMOS chip associated with a MEMS acoustic sensor element and a pressure sensor can be located side by side with the MEMS acoustic sensor element on a package substrate of the integrated package and in the back cavity associated with the MEMS acoustic sensor element. As such, exemplary embodiments can be tested by a singular test set up and can mounted on customer's PCB with one operation. Accordingly, various embodiments as described here can reduce real estate requirements to mount such integrated MEMS acoustic sensor devices on a customer's PCB. Moreover, additional functionality may also be realizable by placing a MEMS acoustic sensor element and a pressure sensor within a well-defined and factory controlled distance within each other.

In a non-limiting aspect, integration of the integrated MEMS acoustic sensor devices can be performed at the package level, whereas exemplary MEMS acoustic sensor elements and pressure sensors can be designed and fabricated separately, which can afford the ability to optimize performance of each of the exemplary MEMS acoustic sensor elements and pressure sensors, and which can reduce integration complexity and fabrication costs.

In non-limiting embodiments, an exemplary pressure sensor can be flip chip attached to a package substrate and an exemplary ASIC can be stacked on top of the exemplary pressure sensor and affixed thereto via a stress isolation compound (e.g., via epoxy, a die attach film, room temperature vulcanization silicone (RTV), etc.), as further described herein. In other non-limiting embodiments, an exemplary ASIC can be flip chip attached to a package substrate and an exemplary pressure sensor can be stacked on top of the exemplary ASIC and affixed thereto via a stress isolation compound (e.g., via epoxy, a die attach film, RTV, etc.), as further described herein, which can also reduce package stress impact on pressure sensor performance.

Figure 1:
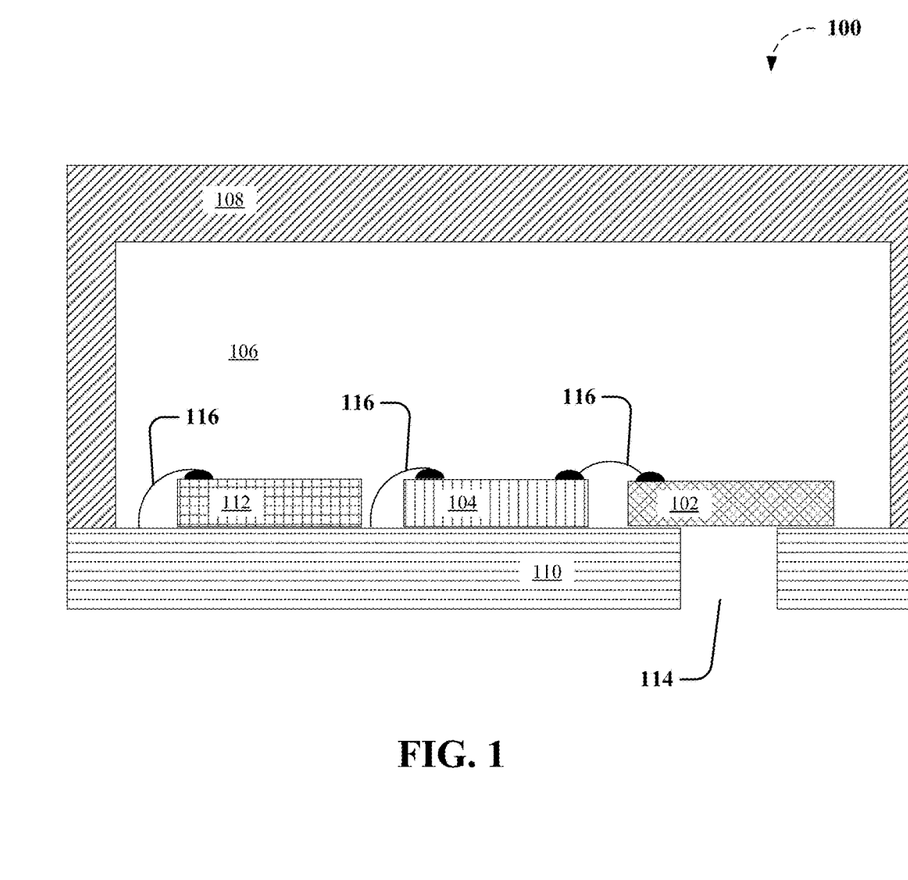
FIG. 1 depicts a non-limiting schematic block diagram of an integrated microelectromechanical systems (MEMS) acoustic sensor device, in which an application specific integrated circuit (ASIC) complementary metal oxide semiconductor (CMOS) chip associated with the MEMS acoustic sensor and a pressure sensor can be located in a back cavity associated with the MEMS acoustic sensor, according to various non-limiting aspects of the subject disclosure.

Accordingly, FIG. 1 depicts non-limiting schematic block diagram of an integrated sensor device 100 (e.g., a MEMS acoustic sensor device or microphone) associated with a back cavity, according to various non-limiting aspects of the subject disclosure. Accordingly, integrated sensor device 100 can comprise a MEMS acoustic sensor element 102, such as a MEMS microphone element or any other acoustic sensor. In various non-limiting implementations, integrated sensor device 100 can also comprise an ASIC complementary metal oxide semiconductor (CMOS) chip 104 associated with the MEMS acoustic sensor element 102.

In non-limiting implementations, integrated sensor device 100 can comprise a back cavity 106, which can be defined by a lid or cover 108 attached to package substrate 110, according to a non-limiting aspect. In a non-limiting embodiment of the subject disclosure, lid or cover 108 can be made of metal, polymer, or ceramic, etc. In further non-limiting implementations, integrated sensor device 100 can comprise pressure sensor 112, as further described herein. In a non-limiting aspect, the operation of the pressure sensor 112 can employ capacitance variation, resistance variation, piezoresistance variation, etc. to sense pressure and pressure variations, without limitation. It can be understood that one or more of MEMS acoustic sensor element 102 or pressure sensor 112 can comprise one or more dies.

In various non-limiting aspects, one or more of MEMS acoustic sensor element 102, ASIC CMOS chip 104, or pressure sensor 112, and/or lid or cover 108 can be one or more of electrically coupled or mechanically affixed to package substrate 110, via methods as further described herein. In addition, one or more of MEMS acoustic sensor element 102 and/or pressure sensor 112 can be mechanically, electrically, and/or communicatively coupled to the ASIC CMOS chip 104 and/or package substrate 110.

Furthermore, lid or cover 108 and package substrate 110 together can comprise integrated sensor device or package 100, to which a customer printed circuit board (PCB) (not shown) having an orifice or other means of passing acoustic waves or pressure to one or more of MEMS acoustic sensor element 102 and/or pressure sensor 112 can be mechanically, electrically, and/or communicatively coupled. For example, acoustic waves can be received at MEMS acoustic sensor element 102 via package substrate 110 having port 114 adapted to receive acoustic waves or pressure. An attached or coupled customer PCB (not shown) providing an orifice or other means of passing the acoustic waves or pressure facilitates receiving acoustic waves or pressure at one or more of MEMS acoustic sensor element 102 and/or pressure sensor 112.

As depicted in integrated sensor device or package 100 of FIG. 1, port 114 is shown aligned with MEMS acoustic sensor element 102, but as further described herein, port 114 need not be aligned with MEMS acoustic sensor element 102 or located in package substrate 110. In addition, port 114 in package substrate 110 can receive acoustic waves or pressure for sensing by MEMS acoustic sensor element 102, and, depending on the embodiment can receive other environmental phenomena such as ambient pressure. MEMS acoustic sensor element 102 is shown positioned adjacent to the ASIC CMOS chip 104 on the package substrate 110, in accordance with exemplary non-limiting embodiments of the subject.

As described above, one or more of MEMS acoustic sensor element 102 and/or pressure sensor 112 can be electrically and/or communicatively coupled to the ASIC CMOS chip 104 and/or package substrate 110. Thus, FIG. 1 depicts wire bonds 116 electrically coupling pressure sensor 112 and ASIC CMOS chip 104 to the package substrate 110 and MEMS acoustic sensor element 102 to ASIC CMOS chip 104. In other non-limiting implementations, pressure sensor 112 can be electrically and/or communicatively coupled to the ASIC CMOS chip 104 such that the ASIC CMOS chip 104 can facilitate processing changes in two sensor elements, for example, sensor elements associated with MEMS acoustic sensor element 102 and pressure sensor 104. Thus, in a non-limiting aspect, sensor element of the MEMS acoustic sensor element 102 and the sensor element of the pressure sensor 112 may share the electronic processing capabilities of the ASIC CMOS chip 104 and/or sensor element of the pressure sensor 112 may employ a separate ASIC (not shown) for electronic processing.

It is understood that dimensional terms, such as "top", "bottom", "side", and the like, as used herein, are relative and their use in describing various embodiments is merely for the sake of discussion and providing examples. It is understood that other dimensional relations may be employed and/or the same dimensional relation may be an opposite relation as that which is disclosed herein. For example, one or more of pressure sensor 112 and/or ASIC CMOS chip 104 can be flipped such that one or more of pressure sensor 112 and/or ASIC CMOS chip 104 can be electrically coupled to package substrate 110 via a flip-chip attachment structure, whereas one of pressure sensor 112 or ASIC CMOS chip 104 can be stacked upon the other adjacent to and along package substrate 110 from MEMS acoustic sensor element 102, as further described herein. While one MEMS acoustic sensor element 102 and one pressure sensor 112 is shown and discussed herein, it is understood that more than one of each such sensors may be employed. The foregoing alternatives apply to the remaining embodiments of the subject disclosure as shown and discussed herein in addition to others not necessarily shown or discussed herein but contemplated.

Figure 2:
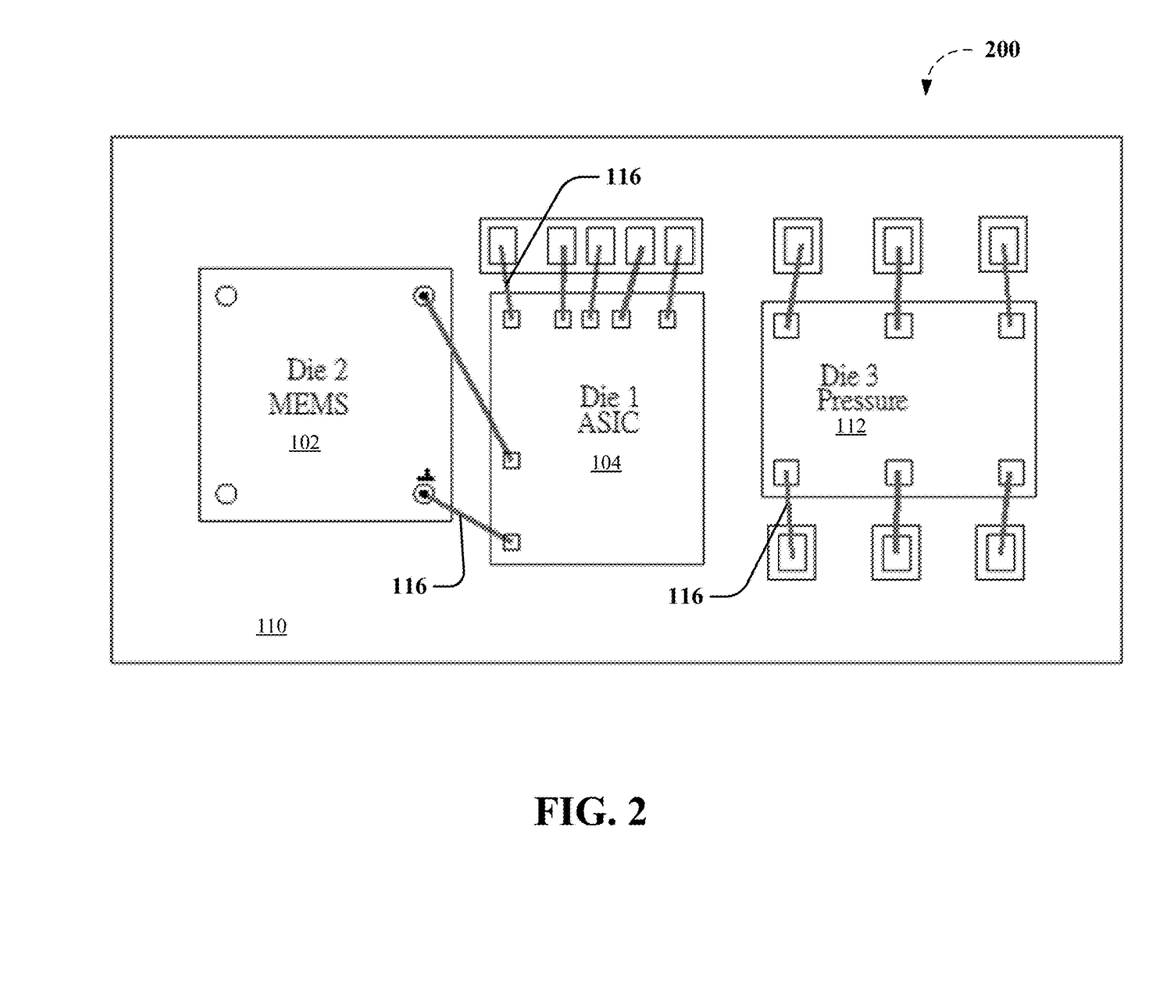
FIG. 2 depicts another schematic block diagram of an integrated MEMS acoustic sensor device, in which an ASIC CMOS chip associated with MEMS acoustic sensor element and pressure sensor are located side by side with the MEMS acoustic sensor element in the back cavity.

FIG. 2 depicts another schematic block diagram of an integrated MEMS acoustic sensor device 200, in which an ASIC CMOS chip 104 associated with MEMS acoustic sensor element 102 and pressure sensor 112 are located side by side with the MEMS acoustic sensor element 102 in the back cavity 106 (not shown). As with integrated sensor device 100 of FIG. 1 described above, integrated sensor device 200 can comprise a MEMS acoustic sensor element 102, such as a MEMS microphone element or any other acoustic sensor, ASIC CMOS chip 104 associated with the MEMS acoustic sensor element 102, and pressure sensor 112 located side by side along package substrate 110. In the integrated sensor device 200 of FIG. 2, one or more of MEMS acoustic sensor element 102, ASIC CMOS chip 104, or pressure sensor 112, can be one or more of electrically coupled or mechanically affixed to package substrate 110. As further described above, one or more of MEMS acoustic sensor element 102 and/or pressure sensor 112 can be electrically and/or communicatively coupled to the ASIC CMOS chip 104 and/or package substrate 110. Thus, FIG. 2 depicts wire bonds 116 electrically coupling pressure sensor 112 and ASIC CMOS chip 104 to the package substrate 110 and MEMS acoustic sensor element 102 to ASIC CMOS chip 104. It can be understood that, in other non-limiting implementations, pressure sensor 112 can be electrically and/or communicatively coupled to the ASIC CMOS chip 104 such that the ASIC CMOS chip 104 can facilitate processing changes in two sensor elements, for example, sensor elements associated with MEMS acoustic sensor element 102 and pressure sensor 104. As a result, in a non-limiting aspect, sensor element of the MEMS acoustic sensor element 102 and the sensor element of the pressure sensor 112 may share the electronic processing capabilities of the ASIC CMOS chip 104 and/or sensor element of the pressure sensor 112 may employ a separate ASIC (not shown) for electronic processing. Moreover, it can be understood that integrated sensor device 200 can comprise a back cavity 106 (not shown), which can be defined by a lid or cover 108 (not shown) attached to package substrate 110 and which lid or cover 108 (not shown) can house or encompass MEMS acoustic sensor element 102, ASIC CMOS chip 104, and pressure sensor 112, according to a non-limiting aspect, as depicted in FIG. 1.

Figure 3:
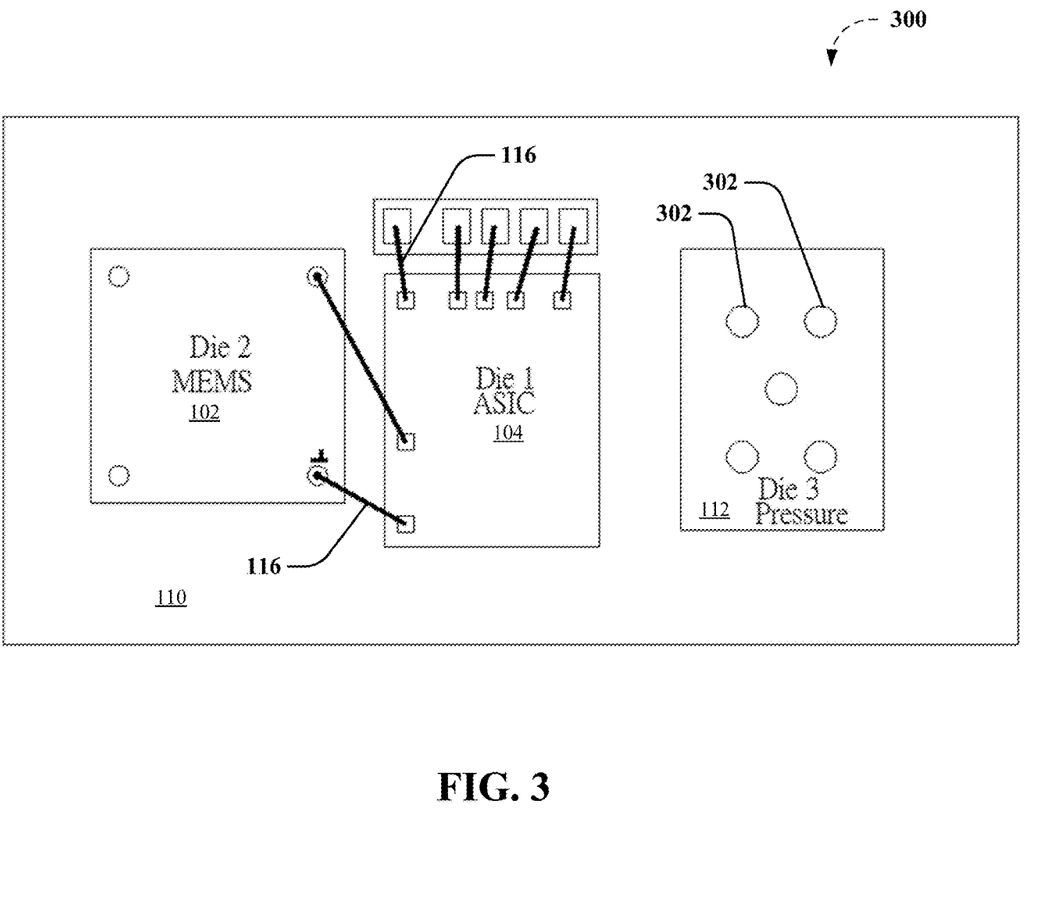
FIG. 3 depicts a further schematic block diagram of an integrated MEMS acoustic sensor device, in which an ASIC CMOS chip associated with MEMS acoustic sensor element and pressure sensor are located side by side with the MEMS acoustic sensor element in the back cavity, according to further non-limiting aspects of the subject disclosure.

FIG. 3 depicts a further schematic block diagram of an integrated MEMS acoustic sensor device 300, in which an ASIC CMOS chip 104 associated with MEMS acoustic sensor element 102 and pressure sensor 112 are located side by side with the MEMS acoustic sensor element 102 in the back cavity 106 (not shown), according to further non-limiting aspects of the subject disclosure. As with integrated sensor device 100/200 of FIGS. 1-2 described above, integrated sensor device 300 can comprise a MEMS acoustic sensor element 102, such as a MEMS microphone element or any other acoustic sensor, ASIC CMOS chip 104 associated with the MEMS acoustic sensor element 102, and pressure sensor 112 located adjacent to MEMS acoustic sensor element 102 and along package substrate 110. In the integrated sensor device 300 of FIG. 3, one or more of MEMS acoustic sensor element 102, ASIC CMOS chip 104, or pressure sensor 112, can be one or more of electrically coupled or mechanically affixed to package substrate 110.

As further described above, one or more of MEMS acoustic sensor element 102 and/or pressure sensor 112 can be electrically and/or communicatively coupled to the ASIC CMOS chip 104 and/or package substrate 110. Thus, FIG. 3 depicts wire bonds 116 electrically coupling ASIC CMOS chip 104 to the package substrate 110 and MEMS acoustic sensor element 102 to ASIC CMOS chip 104. It can be understood that, while for other non-limiting implementations, pressure sensor 112 can be electrically and/or communicatively coupled to the ASIC CMOS chip 104 such that the ASIC CMOS chip 104 can facilitate sensor element of the MEMS acoustic sensor element 102 and the sensor element of the pressure sensor 112 sharing electronic processing capabilities of the ASIC CMOS chip 104, other non-limiting implementations can comprise pressure sensor 112 electrically and/or communicatively coupled to package substrate 110. Thus, in another non-limiting aspect, sensor element of the pressure sensor 112 may employ a separate ASIC (not shown) for electronic processing. As a non-limiting example as depicted in FIG. 3, integrated sensor device 300 can further comprise one or more flip-chip attachment structures 302 (e.g., comprising one or more solder balls, solder bumps, copper pillars, gold bumps, etc.) that can facilitate electrically and/or communicatively coupling pressure sensor 112 to package substrate 110. Moreover, it can be understood that integrated sensor device 300 can comprise a back cavity 106 (not shown), which can be defined by a lid or cover 108 (not shown) attached to package substrate 110 and which lid or cover 108 (not shown) can house or encompass MEMS acoustic sensor element 102, ASIC CMOS chip 104, and pressure sensor 112, according to a non-limiting aspect, as depicted in FIG. 1.

Figure 4:
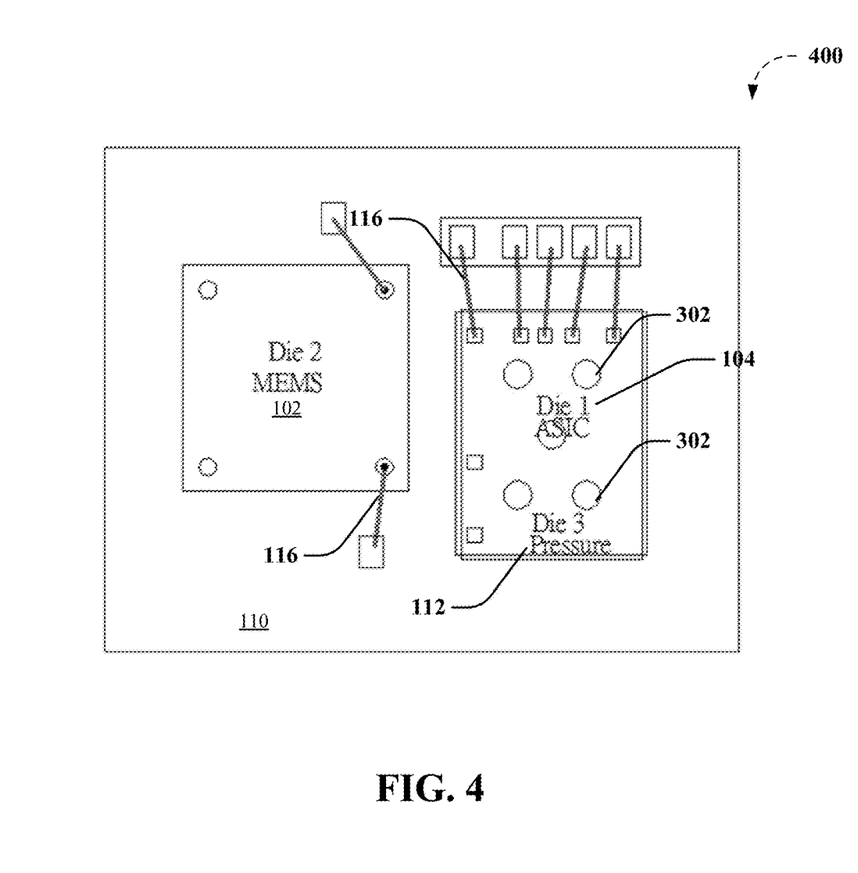
FIG. 4 depicts a non-limiting schematic block diagram of another integrated MEMS acoustic sensor device, in which a pressure sensor is flip chip attached to the package substrate with an ASIC CMOS chip stacked on the pressure sensor in the back cavity, according to further non-limiting aspects of the subject disclosure.

FIG. 4 depicts a non-limiting schematic block diagram of another integrated MEMS acoustic sensor device 400, in which a pressure sensor 112 is flip chip attached to the package substrate 110 with an ASIC CMOS chip 104 stacked on the pressure sensor 112 in the back cavity 106 (not shown), according to further non-limiting aspects of the subject disclosure. As with integrated sensor device 100/200/300 of FIGS. 1-3 described above, integrated sensor device 400 can comprise a MEMS acoustic sensor element 102, such as a MEMS microphone element or any other acoustic sensor, ASIC CMOS chip 104 associated with the MEMS acoustic sensor element 102, and pressure sensor 112 located adjacent to MEMS acoustic sensor element 102 and along package substrate 110. In the integrated sensor device 400 of FIG. 4, one or more of MEMS acoustic sensor element 102, ASIC CMOS chip 104, or pressure sensor 112, can be one or more of electrically coupled or mechanically affixed to package substrate 110. As a non-limiting example as depicted in FIG. 4, integrated sensor device 400 can further comprise one or more flip-chip attachment structures 302 (e.g., comprising one or more solder balls, solder bumps, copper pillars, gold bumps, etc.) that can facilitate electrically and/or communicatively coupling pressure sensor 112 to package substrate 110. As further described herein, ASIC CMOS chip 104 can be located on top of pressure sensor 112, wherein pressure sensor 112 is affixed to the package substrate 110, or between pressure sensor 112 and the package substrate 110. Thus, as depicted in FIG. 4, integrated sensor device 400 can further comprise ASIC CMOS chip 104 stacked on top of pressure sensor 112 and affixed to pressure sensor 112 via a stress isolation compound (not shown) (e.g., via epoxy, a die attach film, RTV, etc.), in a further non-limiting aspect.

As further described above, one or more of MEMS acoustic sensor element 102 and/or pressure sensor 112 can be electrically and/or communicatively coupled to the ASIC CMOS chip 104 and/or package substrate 110. Thus, FIG. 4 depicts wire bonds 116 electrically coupling ASIC CMOS chip 104 and MEMS acoustic sensor element 102 to the package substrate 110. It can be understood that, while for other non-limiting implementations, pressure sensor 112 can be electrically and/or communicatively coupled to the ASIC CMOS chip 104 such that the ASIC CMOS chip 104 can facilitate sensor element of the MEMS acoustic sensor element 102 and the sensor element of the pressure sensor 112 sharing electronic processing capabilities of the ASIC CMOS chip 104, other non-limiting implementations can comprise pressure sensor 112 electrically and/or communicatively coupled to package substrate 110. Thus, in another non-limiting aspect, sensor element of the pressure sensor 112 may employ a separate ASIC (not shown) for electronic processing. Moreover, it can be understood that integrated sensor device 400 can comprise a back cavity 106 (not shown), which can be defined by a lid or cover 108 (not shown) attached to package substrate 110 and which lid or cover 108 (not shown) can house or encompass MEMS acoustic sensor element 102, ASIC CMOS chip 104, and pressure sensor 112, according to a non-limiting aspect, as depicted in FIG. 1, or as further described regarding FIG. 5.

Figure 5:
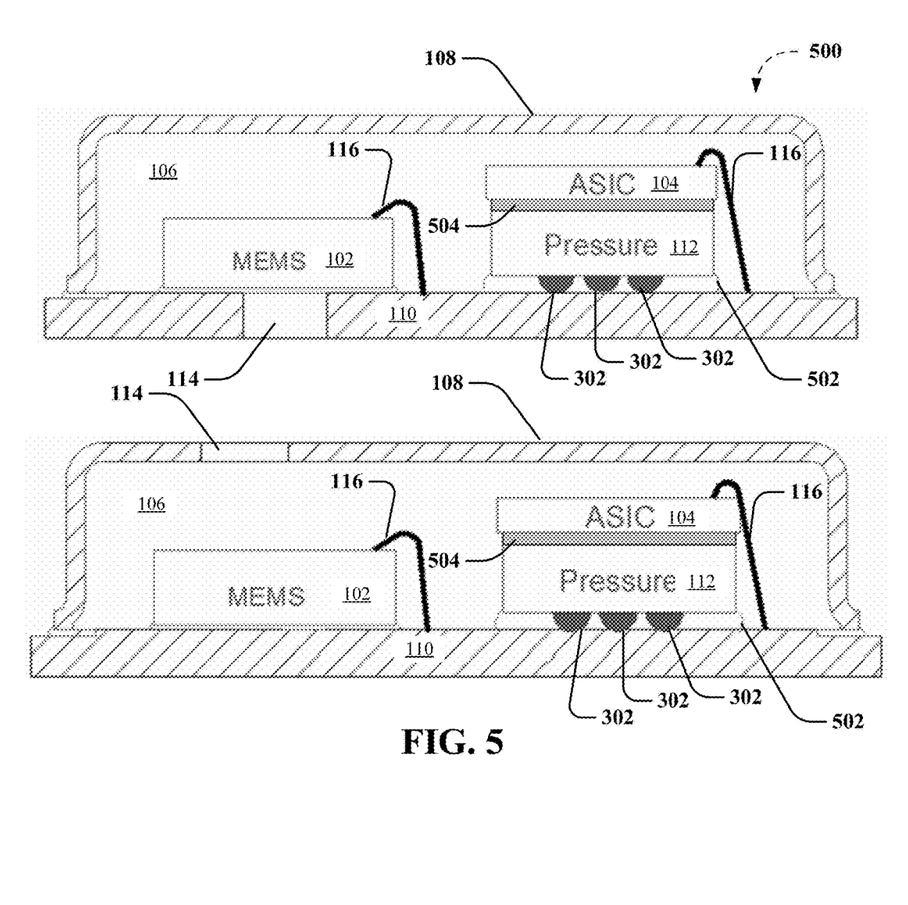
FIG. 5 depicts further schematic block diagrams of integrated MEMS acoustic sensor devices, in which a pressure sensor is flip chip attached to the package substrate with an ASIC CMOS chip stacked on the pressure sensor in the back cavity, according to further non-limiting aspects of the subject disclosure.

FIG. 5 depicts further schematic block diagrams of integrated MEMS acoustic sensor devices 500, in which a pressure sensor 112 is flip chip attached to the package substrate 110 with an ASIC CMOS chip 104 stacked on the pressure sensor 112 in the back cavity 106, according to further non-limiting aspects of the subject disclosure. As with integrated sensor device 100/200/300/400 of FIGS. 1-4 described above, integrated sensor devices 500 can comprise a MEMS acoustic sensor element 102, such as a MEMS microphone element or any other acoustic sensor, ASIC CMOS chip 104 associated with the MEMS acoustic sensor element 102, and pressure sensor 112 located adjacent to MEMS acoustic sensor element 102 and along package substrate 110. In the integrated sensor devices 500 of FIG. 5, one or more of MEMS acoustic sensor element 102, ASIC CMOS chip 104, or pressure sensor 112, can be one or more of electrically coupled or mechanically affixed to package substrate 110. As a non-limiting example as depicted in FIG. 5, integrated sensor devices 500 can further comprise one or more flip-chip attachment structures 302 (e.g., comprising one or more solder balls, solder bumps, copper pillars, gold bumps, etc.) that can facilitate electrically and/or communicatively coupling pressure sensor 112 to package substrate 110. In a non-limiting aspect, various embodiments of integrated sensor devices 500 can comprise an underfill material 502 (e.g., RTV, other soft material, etc.) between pressure sensor 112 and package substrate 110 for stress isolation of pressure sensor 112 from package substrate 110.

As further described herein, ASIC CMOS chip 104 can be located on top of pressure sensor 112, wherein pressure sensor 112 is affixed to the package substrate 110, or between pressure sensor 112 and the package substrate 110. Thus, as depicted in FIG. 5, integrated sensor devices 500 can further comprise ASIC CMOS chip 104 stacked on top of pressure sensor 112 and affixed to pressure sensor 112 via a stress isolation compound 504 (e.g., via epoxy, a die attach film, RTV, etc.), in a further non-limiting aspect. As further described above, one or more of MEMS acoustic sensor element 102 and/or pressure sensor 112 can be electrically and/or communicatively coupled to the ASIC CMOS chip 104 and/or package substrate 110. Thus, FIG. 5 depicts wire bonds 116 electrically coupling ASIC CMOS chip 104 and MEMS acoustic sensor element 102 to the package substrate 110. It can be understood that, while for other non-limiting implementations, pressure sensor 112 can be electrically and/or communicatively coupled to the ASIC CMOS chip 104 such that the ASIC CMOS chip 104 can facilitate sensor element of the MEMS acoustic sensor element 102 and the sensor element of the pressure sensor 112 sharing electronic processing capabilities of the ASIC CMOS chip 104, other non-limiting implementations can comprise pressure sensor 112 electrically and/or communicatively coupled to package substrate 110. Thus, in another non-limiting aspect, sensor element of the pressure sensor 112 may employ a separate ASIC (not shown) for electronic processing. Moreover, it can be understood that integrated sensor devices 500 can comprise a back cavity 106, which can be defined by a lid or cover 108 attached to package substrate 110 and which lid or cover 108 can house or encompass MEMS acoustic sensor element 102, ASIC CMOS chip 104, and pressure sensor 112, according to a non-limiting aspect. In addition, it is noted that port 114 adapted to receive acoustic waves or pressure can be located in package substrate 110 or lid or cover 108 as further depicted regarding integrated sensor devices 500 of FIG. 5.

Figure 6:
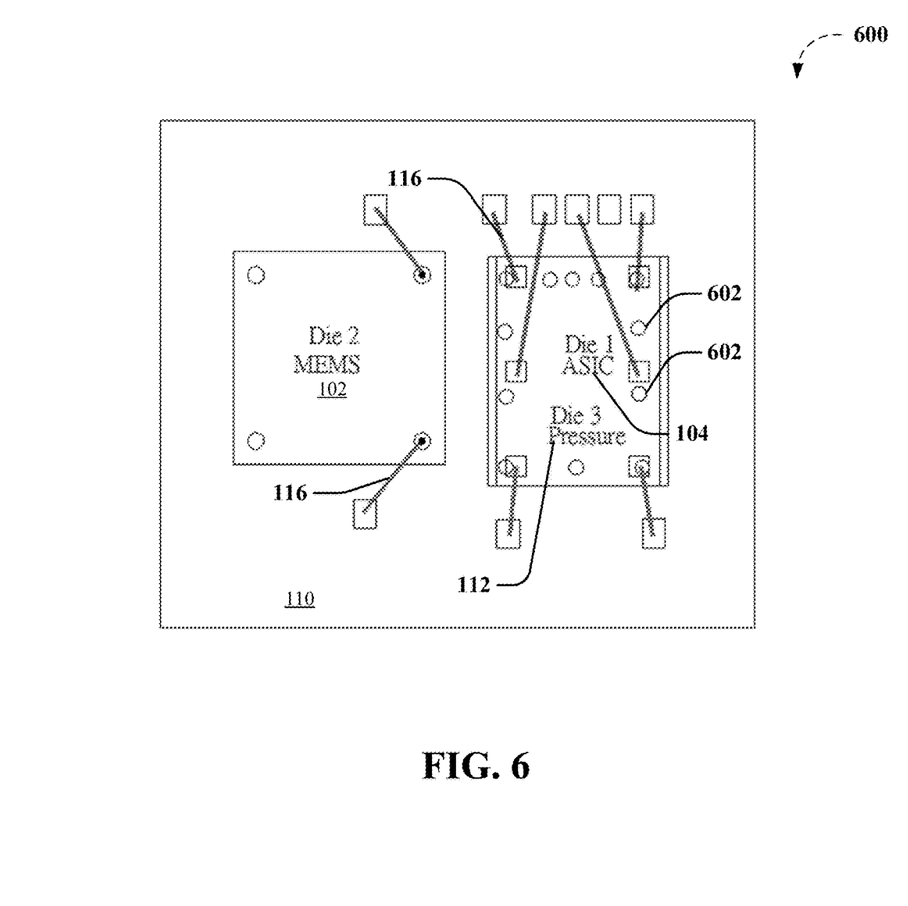
FIG. 6 depicts a non-limiting schematic block diagram of another integrated MEMS acoustic sensor device, in which an ASIC CMOS chip is flip chip attached to the package substrate with a pressure sensor stacked on the ASIC CMOS chip in the back cavity, according to further non-limiting aspects of the subject disclosure.

FIG. 6 depicts a non-limiting schematic block diagram of another integrated MEMS acoustic sensor device 600, in which an ASIC CMOS chip 104 is flip chip attached to the package substrate 110 with a pressure sensor 112 stacked on the ASIC CMOS chip 104 in the back cavity 106 (not shown), according to further non-limiting aspects of the subject disclosure. As with integrated sensor device 100/200/300/400/500 of FIGS. 1-5 described above, integrated sensor device 600 can comprise a MEMS acoustic sensor element 102, such as a MEMS microphone element or any other acoustic sensor, pressure sensor 112, and ASIC CMOS chip 104, associated with the MEMS acoustic sensor element 102, and located adjacent to MEMS acoustic sensor element 102 and along package substrate 110. In the integrated sensor device 600 of FIG. 6, one or more of MEMS acoustic sensor element 102, ASIC CMOS chip 104, or pressure sensor 112, can be one or more of electrically coupled or mechanically affixed to package substrate 110. As a non-limiting example as depicted in FIG. 6, integrated sensor device 600 can further comprise one or more flip-chip attachment structures 602 (e.g., comprising one or more solder balls, solder bumps, copper pillars, gold bumps, etc.) that can facilitate electrically and/or communicatively coupling ASIC CMOS chip 104 to package substrate 110. As further described herein, pressure sensor 112 can be located on top of ASIC CMOS chip 104, wherein ASIC CMOS chip 104 is affixed to the package substrate 110, or between ASIC CMOS chip 104 and the package substrate 110. Thus, as depicted in FIG. 6, integrated sensor device 600 can further comprise pressure sensor 112 stacked on top of ASIC CMOS chip 104 and affixed to ASIC CMOS chip 104 via a stress isolation compound (not shown) (e.g., via epoxy, a die attach film, RTV, etc.), in a further non-limiting aspect.

As further described above, one or more of MEMS acoustic sensor element 102 and/or pressure sensor 112 can be electrically and/or communicatively coupled to the ASIC CMOS chip 104 and/or package substrate 110. Thus, FIG. 6 depicts wire bonds 116 electrically coupling pressure sensor 112 and MEMS acoustic sensor element 102 to the package substrate 110. It can be understood that, while for other non-limiting implementations, pressure sensor 112 can be electrically and/or communicatively coupled to the ASIC CMOS chip 104 such that the ASIC CMOS chip 104 can facilitate sensor element of the MEMS acoustic sensor element 102 and the sensor element of the pressure sensor 112 sharing electronic processing capabilities of the ASIC CMOS chip 104, other non-limiting implementations can comprise pressure sensor 112 electrically and/or communicatively coupled to package substrate 110. Thus, in another non-limiting aspect, sensor element of the pressure sensor 112 may employ a separate ASIC (not shown) for electronic processing. Moreover, it can be understood that integrated sensor device 600 can comprise a back cavity 106 (not shown), which can be defined by a lid or cover 108 (not shown) attached to package substrate 110 and which lid or cover 108 (not shown) can house or encompass MEMS acoustic sensor element 102, ASIC CMOS chip 104, and pressure sensor 112, according to a non-limiting aspect, as depicted in FIG. 1, or as further described regarding FIG. 7.

Figure 7:
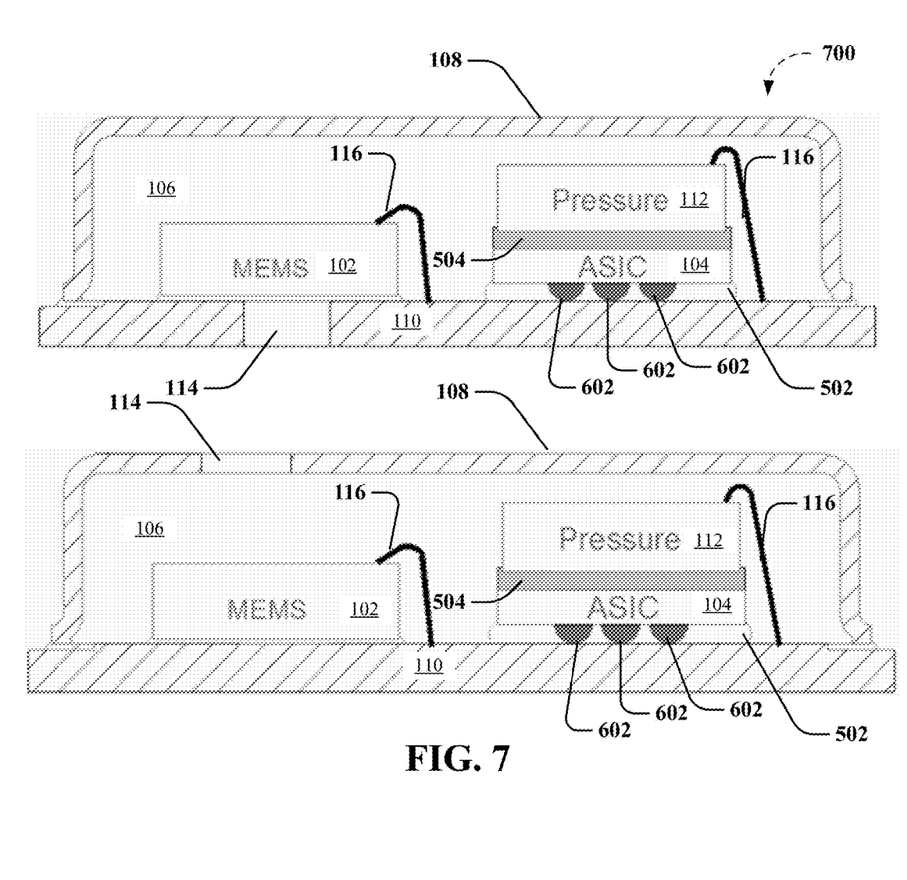
FIG. 7 depicts further schematic block diagrams of integrated MEMS acoustic sensor devices, in which an ASIC CMOS chip is flip chip attached to the package substrate with a pressure sensor stacked on the ASIC CMOS chip in the back cavity, according to further non-limiting aspects of the subject disclosure.

FIG. 7 depicts further schematic block diagrams of integrated MEMS acoustic sensor devices 700, in which an ASIC CMOS chip 104 is flip chip attached to the package substrate 110 with a pressure sensor 112 stacked on the ASIC CMOS chip 104 in the back cavity 106, according to further non-limiting aspects of the subject disclosure. As with integrated sensor device 100/200/300/400/500/600 of FIGS. 1-6 described above, integrated sensor devices 700 can comprise a MEMS acoustic sensor element 102, such as a MEMS microphone element or any other acoustic sensor, pressure sensor 112, and ASIC CMOS chip 104, associated with the MEMS acoustic sensor element 102, and located adjacent to MEMS acoustic sensor element 102 and along package substrate 110. In the integrated sensor devices 700 of FIG. 7, one or more of MEMS acoustic sensor element 102, ASIC CMOS chip 104, or pressure sensor 112, can be one or more of electrically coupled or mechanically affixed to package substrate 110. As a non-limiting example as depicted in FIG. 7, integrated sensor devices 700 can further comprise one or more flip-chip attachment structures 602 (e.g., comprising one or more solder balls, solder bumps, copper pillars, gold bumps, etc.) that can facilitate electrically and/or communicatively coupling ASIC CMOS chip 104 to package substrate 110. In a non-limiting aspect, various embodiments of integrated sensor devices 700 can comprise an underfill material 502 (e.g., RTV, other soft material, etc.) between ASIC CMOS chip 104 and package substrate 110 for stress isolation of ASIC CMOS chip 104 from package substrate 110.

As further described herein, pressure sensor 112 can be located on top of ASIC CMOS chip 104, wherein ASIC CMOS chip 104 is affixed to the package substrate 110, or between ASIC CMOS chip 104 and the package substrate 110. Thus, as depicted in FIG. 7, integrated sensor devices 700 can further comprise pressure sensor 112 stacked on top of ASIC CMOS chip 104 and affixed to ASIC CMOS chip 104 via a stress isolation compound 504 (e.g., via epoxy, a die attach film, room temperature vulcanization silicone (RTV), etc.), in a further non-limiting aspect. As further described above, one or more of MEMS acoustic sensor element 102 and/or pressure sensor 112 can be electrically and/or communicatively coupled to the ASIC CMOS chip 104 and/or package substrate 110. Thus, FIG. 7 depicts wire bonds 116 electrically coupling pressure sensor 112 and MEMS acoustic sensor element 102 to the package substrate 110. It can be understood that, while for other non-limiting implementations, pressure sensor 112 can be electrically and/or communicatively coupled to the ASIC CMOS chip 104 such that the ASIC CMOS chip 104 can facilitate sensor element of the MEMS acoustic sensor element 102 and the sensor element of the pressure sensor 112 sharing electronic processing capabilities of the ASIC CMOS chip 104, other non-limiting implementations can comprise pressure sensor 112 electrically and/or communicatively coupled to package substrate 110. Thus, in another non-limiting aspect, sensor element of the pressure sensor 112 may employ a separate ASIC (not shown) for electronic processing. Moreover, it can be understood that integrated sensor devices 700 can comprise a back cavity 106, which can be defined by a lid or cover 108 attached to package substrate 110 and which lid or cover 108 can house or encompass MEMS acoustic sensor element 102, ASIC CMOS chip 104, and pressure sensor 112, according to a non-limiting aspect. In addition, it is noted that port 114 adapted to receive acoustic waves or pressure can be located in package substrate 110 or lid or cover 108 as further depicted regarding integrated sensor devices 700 of FIG. 7.

Accordingly, various embodiments of the disclosed subject matter can comprise an exemplary sensor device (e.g., an integrated MEMS acoustic sensor device comprising integrated sensor device 100/200/300/400/500 of FIGS. 1-5). In a non-limiting aspect, exemplary sensor device (e.g., an integrated MEMS acoustic sensor device comprising integrated sensor device 100/200/300/400/500 of FIGS. 1-5) can comprise an exemplary package comprising a lid (e.g., lid or cover 108) and a package substrate (e.g., package substrate 110), wherein the package has a port (e.g., port 114) adapted to receive acoustic waves or pressure.

Further non-limiting embodiments of an exemplary sensor device (e.g., an integrated MEMS acoustic sensor device comprising integrated sensor device 100/200/300/400/500 of FIGS. 1-5) can comprise an exemplary MEMS acoustic sensor (e.g., MEMS acoustic sensor element 102) disposed in the package on the package substrate (e.g., package substrate 110), wherein the package defines a back cavity (e.g., back cavity 106) associated with the MEMS acoustic sensor (e.g., MEMS acoustic sensor element 102).

In still other non-limiting embodiments, an exemplary sensor device (e.g., an integrated MEMS acoustic sensor device comprising integrated sensor device 100/200/300/400/500 of FIGS. 1-5) can comprise an exemplary pressure sensor (e.g., pressure sensor 112) disposed in the package adjacent to the MEMS acoustic sensor (e.g., MEMS acoustic sensor element 102) and along the package substrate (e.g., package substrate 110). In a non-limiting aspect, exemplary pressure sensor (e.g., pressure sensor 112) can be electrically coupled to the package substrate (e.g., package substrate 110) via one or more of wire bonds (e.g., wire bonds 116) or one or more flip-chip attachment structures (e.g., one or more flip-chip attachment structures 302 comprising one or more solder balls, solder bumps, copper pillars, gold bumps, etc.).

In further non-limiting embodiments, an exemplary sensor device (e.g., an integrated MEMS acoustic sensor device comprising integrated sensor device 100/200/300/400/500 of FIGS. 1-5) can comprise an exemplary ASIC (e.g., ASIC CMOS chip 104) located in the back cavity (e.g., back cavity 106) and electrically coupled to the MEMS acoustic sensor (e.g., MEMS acoustic sensor element 102). In a non-limiting aspect, exemplary ASIC (e.g., ASIC CMOS chip 104) can be located on top of exemplary pressure sensor (e.g., pressure sensor 112), wherein pressure sensor (e.g., pressure sensor 112) can be affixed to the package substrate, exemplary ASIC (e.g., ASIC CMOS chip 104) can be located between the pressure sensor (e.g., pressure sensor 112) and the package substrate (e.g., package substrate 110), etc. In another non-limiting aspect, exemplary sensor device (e.g., an integrated MEMS acoustic sensor device comprising integrated sensor device 100/200/300/400/500 of FIGS. 1-5) can further comprise an exemplary stress isolation compound (e.g., stress isolation compound 504 such as epoxy, a die attach film, RTV, etc.) located between the pressure sensor (e.g., pressure sensor 112) and the ASIC (e.g., ASIC CMOS chip 104). In still another non-limiting aspect, exemplary ASIC (e.g., ASIC CMOS chip 104) can be electrically coupled to the pressure sensor (e.g., pressure sensor 112), for example, as further described herein. In yet another non-limiting aspect, exemplary ASIC (e.g., ASIC CMOS chip 104) can be electrically coupled to the package substrate (e.g., package substrate 110) via one or more of wire bonds (e.g., wire bonds 116) or one or more flip-chip attachment structures (e.g., one or more flip-chip attachment structures 302 comprising one or more solder balls, solder bumps, copper pillars, gold bumps, etc.).

Various non-limiting embodiments of the disclosed subject matter can also comprise an exemplary integrated microphone and pressure sensing device (e.g., an integrated MEMS acoustic sensor device comprising integrated sensor device 400/500 of FIGS. 4-5). In a non-limiting aspect, exemplary integrated microphone and pressure sensing device can comprise an exemplary package comprising a lid (e.g., lid or cover 108) and a package substrate (e.g., package substrate 110), wherein the package has a port (e.g., port 114) adapted to receive acoustic waves or pressure. In non-limiting aspects an exemplary port (e.g., port 114) adapted to receive acoustic waves or pressure can be located in the lid (e.g., lid or cover 108) or the package substrate (e.g., package substrate 110).

Further non-limiting embodiments of an exemplary integrated microphone and pressure sensing device (e.g., an integrated MEMS acoustic sensor device comprising integrated sensor device 400/500 of FIGS. 4-5) can comprise an exemplary MEMS acoustic sensor (e.g., MEMS acoustic sensor element 102) disposed in the package on the package substrate (e.g., package substrate 110), wherein the package defines a back cavity (e.g., back cavity 106) associated with the MEMS acoustic sensor (e.g., MEMS acoustic sensor element 102).

In still other non-limiting embodiments, an exemplary integrated microphone and pressure sensing device (e.g., an integrated MEMS acoustic sensor device comprising integrated sensor device 400/500 of FIGS. 4-5) can comprise an exemplary pressure sensor (e.g., pressure sensor 112) disposed in the package adjacent to the MEMS acoustic sensor (e.g., MEMS acoustic sensor element 102) on the package substrate (e.g., package substrate 110), wherein exemplary pressure sensor (e.g., pressure sensor 112) can be electrically coupled to the package substrate (e.g., package substrate 110) via one or more flip-chip attachment structures (e.g., one or more flip-chip attachment structures 302 comprising one or more solder balls, solder bumps, copper pillars, gold bumps, etc.).

In further non-limiting embodiments, an exemplary integrated microphone and pressure sensing device (e.g., an integrated MEMS acoustic sensor device comprising integrated sensor device 400/500 of FIGS. 4-5) can comprise an exemplary ASIC (e.g., ASIC CMOS chip 104) located in the back cavity (e.g., back cavity 106) atop the pressure sensor (e.g., pressure sensor 112) and electrically coupled to the MEMS acoustic sensor (e.g., MEMS acoustic sensor element 102) via one or more of wire bonds (e.g., wire bonds 116) to the package substrate (e.g., package substrate 110). In another non-limiting aspect, exemplary integrated microphone and pressure sensing device (e.g., an integrated MEMS acoustic sensor device comprising integrated sensor device 400/500 of FIGS. 4-5) can further comprise an exemplary stress isolation compound (e.g., stress isolation compound 504 such as epoxy, a die attach film, RTV, etc.) located between the pressure sensor (e.g., pressure sensor 112) and the ASIC (e.g., ASIC CMOS chip 104). In still another non-limiting aspect, exemplary ASIC (e.g., ASIC CMOS chip 104) can be electrically coupled to the pressure sensor (e.g., pressure sensor 112), for example, as further described herein. In yet another non-limiting aspect, exemplary ASIC (e.g., ASIC CMOS chip 104) can be electrically coupled to the package substrate (e.g., package substrate 110) via one or more of wire bonds (e.g., wire bonds 116).

Various other non-limiting embodiments of the disclosed subject matter can also comprise an exemplary integrated microphone and pressure sensing device (e.g., an integrated MEMS acoustic sensor device comprising integrated sensor device 600/700 of FIGS. 6-7). In a non-limiting aspect, exemplary integrated microphone and pressure sensing device can comprise an exemplary package comprising a lid (e.g., lid or cover 108) and a package substrate (e.g., package substrate 110), wherein the package has a port (e.g., port 114) adapted to receive acoustic waves or pressure. In non-limiting aspects, an exemplary port (e.g., port 114) adapted to receive acoustic waves or pressure can be located in the lid (e.g., lid or cover 108) or the package substrate (e.g., package substrate 110).

Further non-limiting embodiments of an exemplary integrated microphone and pressure sensing device (e.g., an integrated MEMS acoustic sensor device comprising integrated sensor device 600/700 of FIGS. 6-7) can comprise an exemplary MEMS acoustic sensor (e.g., MEMS acoustic sensor element 102) disposed in the package on the package substrate (e.g., package substrate 110), wherein the package defines a back cavity (e.g., back cavity 106) associated with the MEMS acoustic sensor (e.g., MEMS acoustic sensor element 102).

In still other non-limiting embodiments, an exemplary integrated microphone and pressure sensing device (e.g., an integrated MEMS acoustic sensor device comprising integrated sensor device 600/700 of FIGS. 6-7) can comprise an exemplary ASIC (e.g., ASIC CMOS chip 104) disposed in the package adjacent to the MEMS acoustic sensor (e.g., MEMS acoustic sensor element 102) on the package substrate (e.g., package substrate 110), wherein exemplary ASIC (e.g., ASIC CMOS chip 104) can be electrically coupled to the package substrate (e.g., package substrate 110) via one or more flip-chip attachment structures (e.g., one or more flip-chip attachment structures 302 comprising one or more solder balls, solder bumps, copper pillars, gold bumps, etc.).

In further non-limiting embodiments, an exemplary integrated microphone and pressure sensing device (e.g., an integrated MEMS acoustic sensor device comprising integrated sensor device 600/700 of FIGS. 6-7) can comprise an exemplary pressure sensor (e.g., pressure sensor 112) located in the back cavity (e.g., back cavity 106) atop ASIC (e.g., ASIC CMOS chip 104) and electrically coupled to the package substrate (e.g., package substrate 110) via one or more of wire bonds (e.g., wire bonds 116). In another non-limiting aspect, exemplary integrated microphone and pressure sensing device (e.g., an integrated MEMS acoustic sensor device comprising integrated sensor device 600/700 of FIGS. 6-7) can further comprise an exemplary stress isolation compound (e.g., stress isolation compound 504 such as epoxy, a die attach film, RTV, etc.) located between the pressure sensor (e.g., pressure sensor 112) and the ASIC (e.g., ASIC CMOS chip 104).

Figure 8:
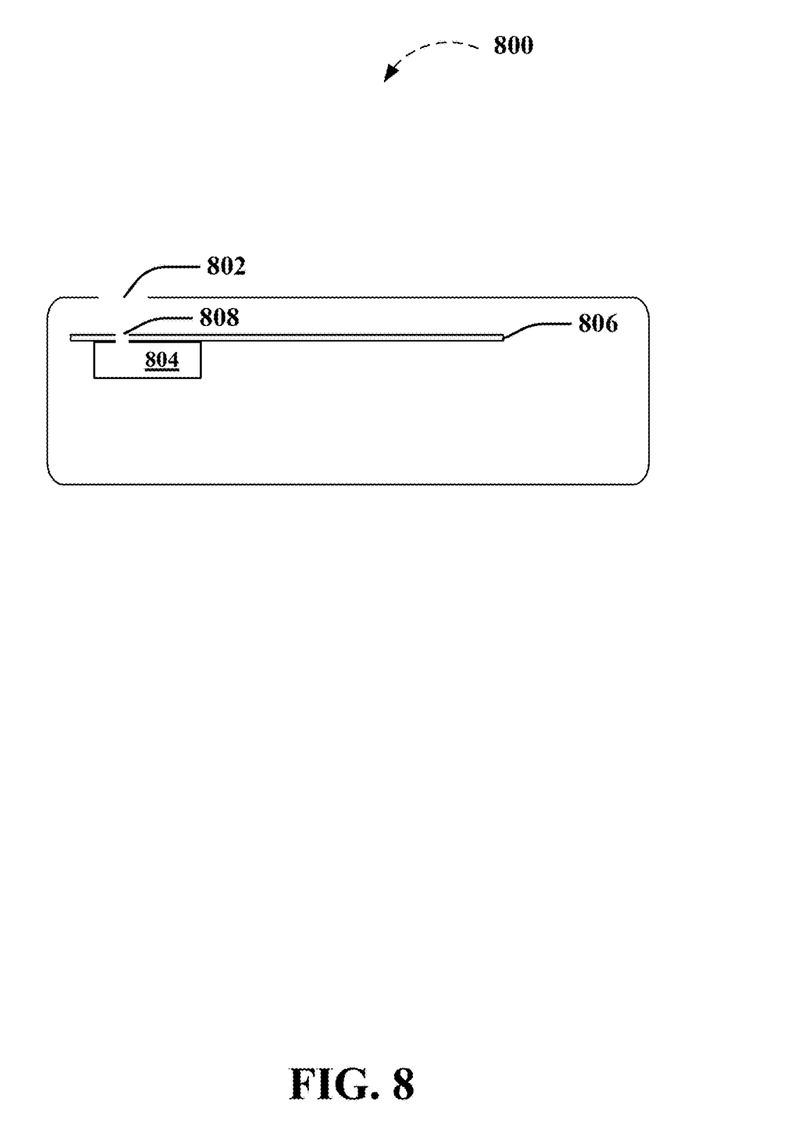
FIG. 8 depicts an example schematic block diagram for a computing environment in accordance with certain embodiments of this disclosure.

FIG. 8 illustrates a block diagram representative of an exemplary application of various embodiments of the subject disclosure. More specifically, a block diagram of a host system 800 is shown to include an acoustic port 802 and an integrated sensor device 804 (e.g., an integrated MEMS acoustic sensor device comprising integrated sensor device 100/200/300/400/500/600/700 of FIGS. 1-7) affixed to a PCB 806 having an orifice 808 or other means of passing acoustic waves or pressure to integrated sensor device 804 (e.g., an integrated MEMS acoustic sensor device comprising integrated sensor device 100/200/300/400/500/600/700 of FIGS. 1-7). The host system 800 can be any system requiring and integrated sensor device 804 (e.g., an integrated MEMS acoustic sensor device comprising integrated sensor device 100/200/300/400/500/600/700 of FIGS. 1-7), such as a smartphone, a smart watch, a wearable exercise device, etc.

Figure 9:
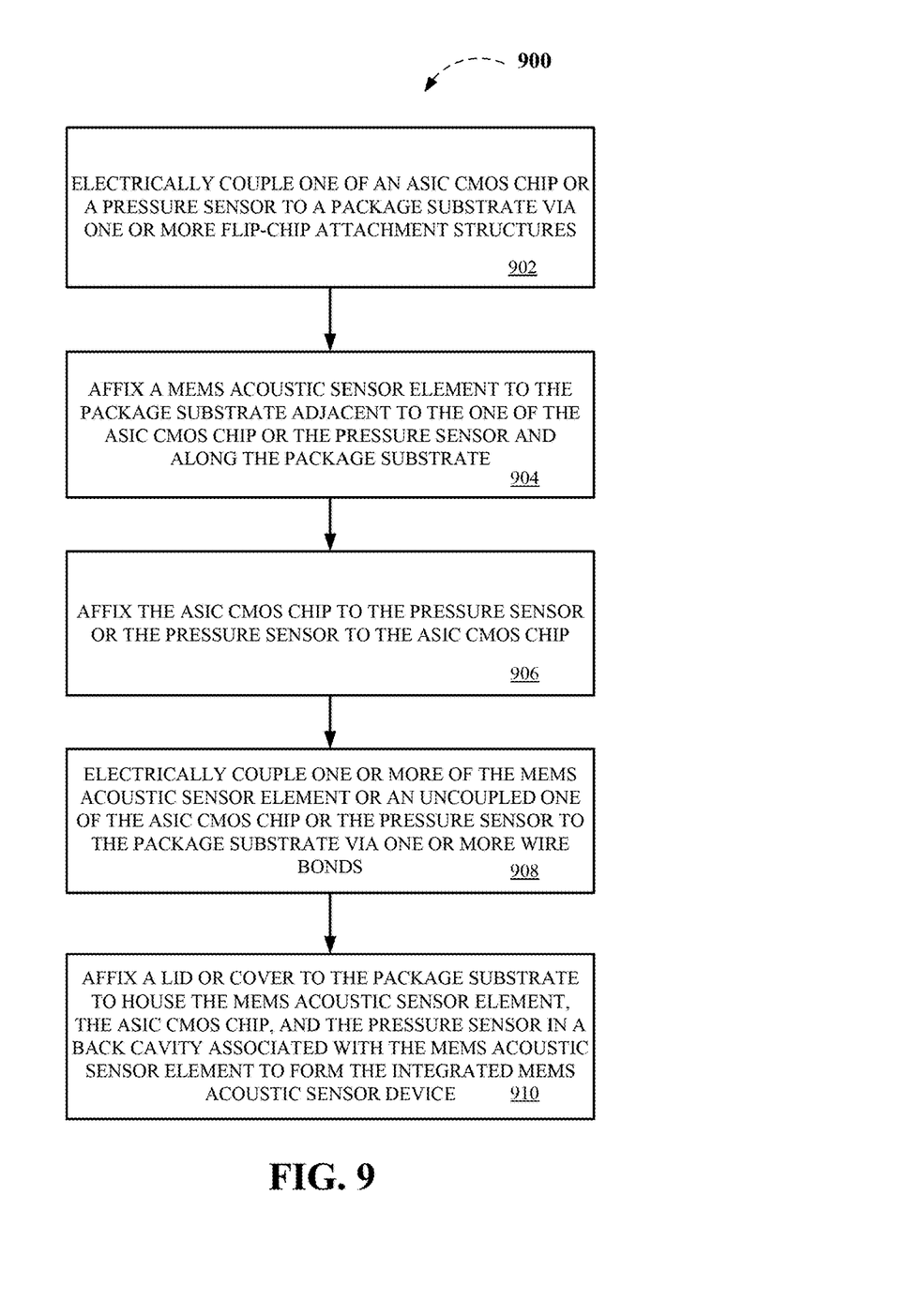
FIG. 9 depicts an exemplary flowchart of non-limiting methods associated with an integrated MEMS acoustic sensor device, according to various non-limiting aspects of the disclosed subject matter.

In view of the subject matter described supra, methods that can be implemented in accordance with the subject disclosure will be better appreciated with reference to the flowchart of FIG. 9. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 9 depicts an exemplary flowchart of non-limiting methods 900 associated with an integrated MEMS acoustic sensor device (e.g., an integrated MEMS acoustic sensor device comprising integrated sensor device 400/500/600/700 of FIGS. 4-7), according to various non-limiting aspects of the subject disclosure. As a non-limiting example, exemplary methods 900 can comprise, at 902, electrically coupling one of an ASIC CMOS chip 104 or a pressure sensor 112 to a package substrate 110 via one or more flip-chip attachment structures 302/602 (e.g., comprising one or more solder balls, solder bumps, copper pillars, gold bumps, etc.). In a non-limiting aspect, exemplary methods 900 can further comprise applying an underfill material 502 (e.g., RTV, other soft material, etc.) between pressure sensor 112 and package substrate 110, for stress isolation of pressure sensor 112 from package substrate 110, or between ASIC CMOS chip 104 and package substrate 110, for stress isolation of ASIC CMOS chip 104 from package substrate 110, as further described herein.

In other non-limiting implementations of methods 900, exemplary methods 900 can comprise, at 904, affixing a MEMS acoustic sensor element 102 to the package substrate 110 adjacent to the one the ASIC CMOS chip 104 or the pressure sensor 112 and along the package substrate 110, as further described herein, regarding FIGS. 4-7, for example. As a non-limiting example, exemplary methods 900 can further comprise aligning an exemplary MEMS acoustic sensor element 102 with an exemplary port 114 adapted to receive acoustic waves or pressure.

In still further non-limiting implementations of methods 900, exemplary methods 900 can comprise, at 906, affixing the ASIC CMOS chip 104 to the pressure sensor 112 or affixing the pressure sensor 112 to the ASIC CMOS chip 104, as further described herein, regarding FIGS. 4-7, for example. In a non-limiting aspect, exemplary methods 900 can comprise affixing the ASIC CMOS chip 104 or the pressure sensor 112 via a stress isolation compound 504 (e.g., via epoxy, a die attach film, RTV, etc.).

Exemplary methods 900 can further comprise, at 908, electrically coupling one or more of the MEMS acoustic sensor element 102 or an uncoupled one of the ASIC CMOS chip 104 or the pressure sensor 112 to the package substrate 110 via one or more wire bonds 116. As a non-limiting example, for an exemplary integrated MEMS acoustic sensor device comprising a flip-chip attached pressure sensor 112, exemplary methods 900 can comprise electrically coupling the ASIC CMOS chip 104 to the package substrate 110 via one or more wire bonds 116. In a further non-limiting example, for an exemplary integrated MEMS acoustic sensor device comprising a flip-chip attached ASIC CMOS chip 104, exemplary methods 900 can comprise electrically coupling the pressure sensor 112 to the package substrate 110 via one or more wire bonds 116.

Exemplary methods 900 can further comprise, at 910, affixing lid or cover 108 to the package substrate 110 to house the MEMS acoustic sensor element 102, the ASIC CMOS chip 104, and the pressure sensor 112 in a back cavity associated with the MEMS acoustic sensor element 102 to form the integrated MEMS acoustic sensor device.

Although the description has been provided with respect to particular embodiments of the disclosed subject matter, these particular embodiments are merely illustrative and not restrictive.

As used herein, the term "top", "bottom", "left", and "right" are relative and merely examples of the structures disclosed. It is understood that the relation of the structures may be opposite to that which is stated. For example, the term "bottom", as used herein, may be "top" in other embodiments of the subject disclosure.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What is claimed is:

1. A sensor device, comprising:
   a package comprising a lid and a package substrate, wherein the package has a port adapted to receive acoustic waves;
   a microelectromechanical systems (MEMS) acoustic sensor disposed in the package on the package substrate, wherein the package defines an acoustically-sealed back cavity associated with the MEMS acoustic sensor;
   an application specific integrated circuit (ASIC) located in the acoustically-sealed back cavity and electrically coupled to the MEMS acoustic sensor and affixed to the package substrate via a flip-chip attachment structure;
   a pressure sensor disposed in the acoustically sealed back cavity and exposed to an atmosphere within the acoustically sealed back cavity, wherein the pressure sensor and the ASIC comprise a vertical stack;
   a stress isolation compound located between the pressure sensor and the ASIC; and
   an underfill material located between the vertical stack and the package substrate, wherein the underfill material comprises a material different from the atmosphere.

2. The sensor device of claim 1, wherein the stress isolation compound positions the pressure sensor in the acoustically-sealed back cavity, free of mechanical contact with the lid and the package substrate.

3. The sensor device of claim 1, wherein the stress isolation compound comprises at least one of a room temperature vulcanization silicone (RTV), an epoxy, or a die attach film.

4. The sensor device of claim 1, wherein the ASIC is electrically coupled to the pressure sensor.

5. The sensor device of claim 1, wherein the pressure sensor is electrically coupled to the package substrate via a first plurality of wire bonds.

6. The sensor device of claim 1, wherein the flip-chip attachment structure comprises at least one of a plurality of solder balls, a plurality of copper pillars, or a plurality of gold bumps.

7. An integrated microphone and pressure sensing device, comprising:
   a package comprising a lid and a package substrate, wherein the package has a port adapted to receive acoustic waves;
   a microelectromechanical systems (MEMS) acoustic sensor disposed in the package on the package substrate, wherein the package defines an acoustically-sealed back cavity associated with the MEMS acoustic sensor;
   an application specific integrated circuit (ASIC) located in the acoustically-sealed back cavity and electrically coupled to the MEMS acoustic sensor and affixed to the package substrate via a flip-chip attachment structure;
   a pressure sensor exposed to an atmosphere within the acoustically sealed back cavity, wherein the pressure sensor and the ASIC comprise a vertical stack;
   an underfill material located between the vertical stack and the package substrate wherein the underfill material comprises a material different from the atmosphere; and
   a stress isolation compound located between the pressure sensor and the ASIC.

8. The integrated microphone and pressure sensing device of claim 7, wherein the stress isolation compound mechanically affixes the pressure sensor to the package substrate via the ASIC.

9. The integrated microphone and pressure sensing device of claim 7, wherein the stress isolation compound comprises at least one of a room temperature vulcanization silicone (RTV), an epoxy, or a die attach film.

10. The integrated microphone and pressure sensing device of claim 7, wherein the pressure sensor is electrically coupled to the package substrate via a plurality of wire bonds to the package substrate.

11. The integrated microphone and pressure sensing device of claim 7, wherein the flip-chip attachment structure comprises at least one of a plurality of solder balls, a plurality of copper pillars, or a plurality of gold bumps.

12. The integrated microphone and pressure sensing device of claim 7, wherein the port is located in the lid.

13. The integrated microphone and pressure sensing device of claim 7, wherein the port is located in the package substrate.

14. An integrated microphone and pressure sensing device, comprising:
   a package comprising a lid and a package substrate, wherein the package has a port adapted to receive acoustic waves;
   a microelectromechanical systems (MEMS) acoustic sensor disposed in the package on the package substrate, wherein the package defines an acoustically-sealed back cavity associated with the MEMS acoustic sensor;
   an application specific integrated circuit (ASIC) disposed in the package adjacent to the MEMS acoustic sensor and electrically coupled and affixed to the package substrate via a flip-chip attachment structure;

a pressure sensor exposed to an atmosphere within the acoustically sealed back cavity, wherein the pressure sensor and the ASIC comprise a vertical stack, and wherein the pressure sensor is free of mechanical contact with the lid;

a stress isolation compound located between the pressure sensor and the ASIC; and an underfill material located between the vertical stack and the package substrate wherein the underfill material comprises a material different from the atmosphere.

15. The integrated microphone and pressure sensing device of claim 14, wherein the stress isolation compound mechanically affixes the pressure sensor to the package substrate via the ASIC, and wherein the stress isolation compound positions the pressure sensor in the acoustically-sealed back cavity, free of mechanical contact with the lid and the package substrate.

16. The integrated microphone and pressure sensing device of claim 14, wherein the stress isolation compound comprises at least one of a room temperature vulcanization silicone (RTV), an epoxy, or a die attach film.

17. The integrated microphone and pressure sensing device of claim 14, wherein the flip-chip attachment structure comprises at least one of a plurality of solder balls, a plurality of copper pillars, or a plurality of gold bumps.

18. The integrated microphone and pressure sensing device of claim 14, wherein the port is located in the lid.

19. The integrated microphone and pressure sensing device of claim 14, wherein the port is located in the package substrate.

* * * * *